United States Patent
Jones et al.

(10) Patent No.: US 11,527,484 B2
(45) Date of Patent: Dec. 13, 2022

(54) DIELECTRIC FILLER MATERIAL IN CONDUCTIVE MATERIAL THAT FUNCTIONS AS FIDUCIAL FOR AN ELECTRONIC DEVICE

(71) Applicant: Intel Corporation, Santa Clara, CA (US)

(72) Inventors: Jesse C. Jones, Chandler, AZ (US); Gang Duan, Chandler, AZ (US); Jason Gamba, Gilbert, AZ (US); Yosuke Kanaoka, Phoenix, AZ (US); Rahul N. Manepalli, Chandler, AZ (US); Vishal Shajan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 81 days.

(21) Appl. No.: 17/078,897

(22) Filed: Oct. 23, 2020

(65) Prior Publication Data

US 2021/0043580 A1    Feb. 11, 2021

Related U.S. Application Data

(62) Division of application No. 16/037,504, filed on Jul. 17, 2018, now Pat. No. 10,847,471.

(51) Int. Cl.
*H01L 23/544* (2006.01)
*H01L 21/762* (2006.01)
*H01L 23/538* (2006.01)

(52) U.S. Cl.
CPC ...... *H01L 23/544* (2013.01); *H01L 21/76224* (2013.01); *H01L 23/5386* (2013.01); *H01L 2223/54426* (2013.01)

(58) Field of Classification Search
CPC ............. H01L 23/544; H01L 21/76224; H01L 23/5386
See application file for complete search history.

(56) References Cited

U.S. PATENT DOCUMENTS

| | | |
|---|---|---|
| 5,475,268 A | 12/1995 | Kawagoe |
| 5,757,199 A | 5/1998 | Maruyama |
| 6,136,662 A | 10/2000 | Allman |
| 6,495,928 B1 | 12/2002 | Hashizume |
| 6,677,682 B1 | 1/2004 | Fujiki |
| 6,756,158 B2 * | 6/2004 | Yan ................. B82Y 40/00 430/296 |
| 9,735,114 B1 * | 8/2017 | Xu ..................... H01L 24/19 |

(Continued)

*Primary Examiner* — Michael Jung
(74) *Attorney, Agent, or Firm* — Schwabe, Williamson & Wyatt, P.C.

(57) ABSTRACT

An electronic device includes a substrate, and the substrate may include one or more layers. The one or more layers may include a dielectric material and may include one or more electrical traces. The electronic device may include a layer of conductive material, and the layer of conductive material may define a void in the conductive material. The electronic device may include a fiducial mark, and the fiducial mark may include a filler material positioned in the void defined by the conductive material. The fiducial mark may be coupled to the layer of conductive material. The filler material may have a lower reflectivity in comparison to the conductive material, for instance to provide a contrast with the conductive material.

17 Claims, 7 Drawing Sheets

(56) References Cited

U.S. PATENT DOCUMENTS

| | | | |
|---|---|---|---|
| 2015/0122698 A1* | 5/2015 | Lo | B65D 1/36 |
| | | | 206/710 |
| 2015/0145145 A1* | 5/2015 | Tsuyutani | H01L 24/05 |
| | | | 438/126 |
| 2015/0348904 A1* | 12/2015 | Huang | H01L 23/5383 |
| | | | 438/666 |
| 2016/0005665 A1 | 1/2016 | Suzuki | |
| 2016/0086894 A1* | 3/2016 | Rorane | H01L 23/562 |
| | | | 257/734 |
| 2017/0005054 A1 | 1/2017 | Chiu | |

* cited by examiner

US 11,527,484 B2

DIELECTRIC FILLER MATERIAL IN CONDUCTIVE MATERIAL THAT FUNCTIONS AS FIDUCIAL FOR AN ELECTRONIC DEVICE

CROSS-REFERENCE TO RELATED APPLICATIONS

This application is a division of U.S. patent application Ser. No. 16/037,504, filed on Jul. 17, 2018, the entire contents of which is hereby incorporated by reference herein.

BACKGROUND

A fiducial mark is utilized as a reference point to determine the positional relationship between a first object and a second object.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized, among other things, that a problem to be solved may include determining the position of a first object (e.g., a substrate) with respect to a second object (e.g., a semiconductor die, for instance an interconnect bridge). Additionally, the present inventors have recognized, among other things, that a problem to be solved may include increasing the accuracy and precision of positioning the second object (e.g., the semiconductor die) with respect to the first object (e.g., a cavity defined in the substrate). Further, the present inventors have recognized, among other things, that a problem to be solved may include distinguishing a fiducial mark from other structures of an electronic device (e.g., a via or an electrical trace).

The present subject matter may help provide a solution to these problems, such as with an electronic device. The electronic device includes a substrate, and the substrate may include one or more layers. The one or more layers may include a dielectric material and may include one or more electrical traces. The electronic device may include a layer of conductive material, and the layer of conductive material may define a void in the conductive material. The electronic device may include a fiducial mark, and the fiducial mark may include a filler material positioned in the void defined by the conductive material. The fiducial mark may be coupled to the layer of conductive material. The filler material may have a lower reflectivity in comparison to the conductive material, for instance to provide a contrast with the conductive material.

Figure 1:
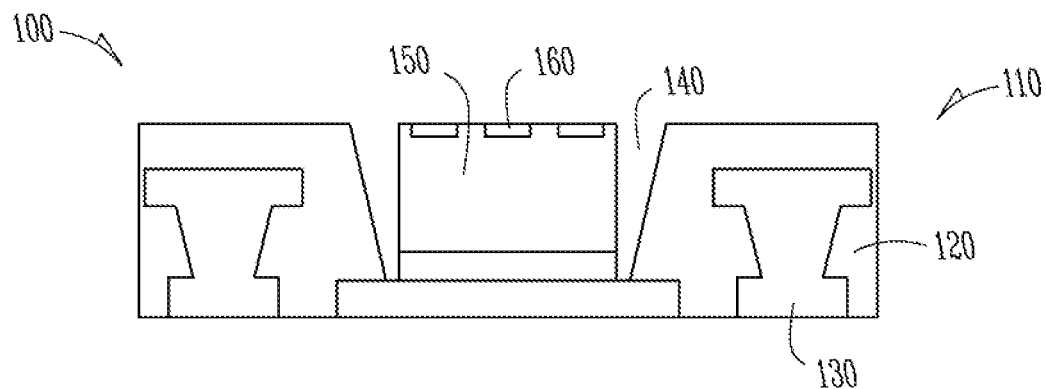
FIG. 1 illustrates a schematic, cross-sectional view of one example of an electronic device, in accordance with an example of the present subject matter.

FIG. 1 illustrates a schematic, cross-sectional view of one example of an electronic device 100, in accordance with an example of the present subject matter. The electronic device 100 includes a substrate 110. The substrate 110 may include one or more layers, and the one or more layers may include a dielectric material 120 and electrical traces (e.g., the electrical traces 210 of FIG. 2). The electronic device 100 may include a via 130, and the via 130 may facilitate the electrical communication between the one or more layers of the substrate 110.

In some examples, the substrate 110 defines a cavity 140 in the substrate 110. For example, a photoresist may be applied to the substrate 110, and the photoresist may be cured. The dielectric material 120 may be coupled to the substrate 110, and the cured photoresist may be removed from the substrate 110 (e.g., by dissolving the cured photoresist). The removal of the photoresist from the substrate 110 may create the cavity 140 in the substrate 110. In another example, the dielectric material 120 is removed (e.g., ablated, for instance with a laser) and the removal of the dielectric material 120 from the substrate 110 creates the cavity 140.

As shown in FIG. 1, the cavity 140 may extend partially through the substrate 110. In an example, the cavity 140 extends from a top surface of the substrate 110, and extends into a thickness of the substrate 110. In an example, the cavity 140 extends through the thickness of the substrate 110, and additional layers (e.g., including dielectric material and electrical traces) are coupled to the substrate 110. In another example, a bottom of the cavity 140 is defined by a conductive material. The cavity 140 may have a rectangular periphery, but the present subject matter is not so limited. The periphery of the cavity 140 may have a variety of shapes (e.g., square, circular, triangular, other polygonal shapes, or amorphous in shape).

The electronic device 100 may include a semiconductor die 150, including but not limited to a passive die, an interconnect bridge, a logic die, a memory die, a TSV die, or the like. In an example, the semiconductor die 150 is coupled to a surface of the substrate 110 (e.g., a top surface of the substrate 110). The semiconductor die 150 may be encapsulated in a dielectric material (e.g., the dielectric material 120).

In another example, the cavity 140 may be adapted to (e.g., sized and shaped) to receive the semiconductor die 150. In an example, the semiconductor die 150 is a first semiconductor die 150, and the first semiconductor die 150 may facilitate the electrical communication of components of the electronic device 100 (e.g., the electrical communication between a second semiconductor die and a third semiconductor die). The semiconductor die 150 may be coupled to a surface (e.g., a bottom surface or wall) of the substrate 110 that defines a portion of the cavity 140. For instance, the semiconductor die 150 may be positioned in the cavity 140 of the substrate 110, and the semiconductor die 150 may be coupled to a bottom surface (e.g., a copper layer) that defines a portion of the cavity 140. The semiconductor die 150 may include a semiconductor material.

As described herein, the semiconductor die 150 may be a first semiconductor die 150 and may facilitate the electrical communication between components of the electronic device 100 (e.g., the communication between a second die and a third die). The first semiconductor die 150 may include die contacts 160. The die contacts 160 may include conductive pins, pads, sockets, or the like. The die contacts 160 may facilitate the electrical communication of the semiconductor die 150 with additional structures of the electronic device (e.g., the via 130 or the electrical traces 220 shown in FIG. 2).

For instance, additional layers (e.g., of the first dielectric material 120 and electrical traces) may be coupled to the substrate 110, and the additional layers may encapsulate (e.g., enclose, surround, or the like) the semiconductor die 150 in the substrate 110. The electrical traces may be coupled to the die contacts 160, and the electrical traces may route electrical signals to and from the semiconductor die 150. Additionally, the electrical traces may be coupled to a second die and a third die (or additional die), and the electrical signals may be transmitted from the second die, through the first semiconductor die 150, and to the third die (or from the third die to the second die). The first semiconductor die 150 may electrically interconnect two or more die (e.g., the second die and the third die).

Figure 2:
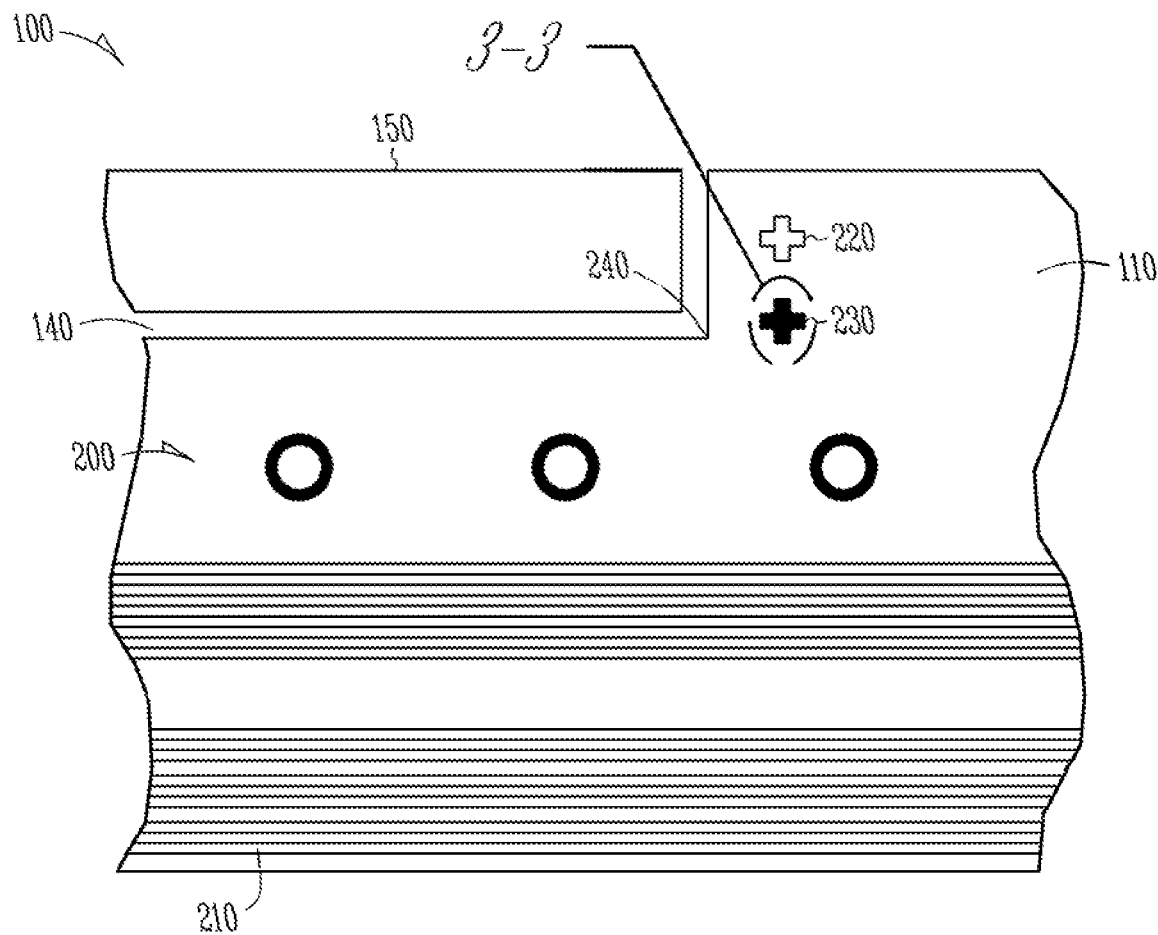
FIG. 2 illustrates a schematic, planar view of one example of the electronic device, in accordance with an example of the present subject matter.

FIG. 2 illustrates a schematic, planar view of one example of the electronic device 100, in accordance with an example of the present subject matter. As described herein, the substrate 110 may define the cavity 140. In an example, the semiconductor die 150 is coupled to a surface (e.g., a top surface) of the substrate 110. In another example, the semiconductor die 150 may be positioned in the cavity 140 of the substrate 110, and the semiconductor die 150 may be coupled to the substrate 110.

The electronic device 100 may include a layer of conductive material 200. The conductive layer 200 may be coupled to the substrate 110. The layer of conductive material 200 may include electrical traces 210. For example, the conductive layer 200 may be plated to a surface (e.g., a top surface) of the substrate 110. The first dielectric material 120 (shown in FIG. 1), may electrically isolate individual electrical traces 210. The layer of conductive material 200 may include copper, gold, aluminum, or the like.

The layer of conductive material 200 may define a void 220 in the conductive material. For instance, a photoresist is applied to the substrate 110, and the photoresist is cured (e.g., by exposure to light) and the photoresist hardens in a desired shape, including but not limited to the shape of void 220. The layer of conductive material 200 is coupled to the substrate 110 (e.g., by a plating operation) and the layer of conductive material 200 is coupled to (e.g., surrounds, or envelops) the cured photoresist. The cured photoresist is removed (e.g., with a solvent), and the void 220 will remain in the layer of conductive material 200.

The electronic device 100 may include a fiducial mark 230. The fiducial mark 230 may include a filler material, including (but not limited to) the first dielectric material 120 (shown in FIG. 1), or a second dielectric material. The first dielectric material and the second dielectric material may be different. The void 220 in the layer of conductive material 200 may have various configurations (e.g., corresponding to the design of the fiducial marks shown in FIGS. 3-6).

The fiducial mark 230 may be positioned in the void 220 that may be defined by the layer of conductive material 200. In an example, the layer of conductive material 200 is included in an exposed surface of the substrate 110, and the layer of conductive material defines the void 220 in the exposed surface of the substrate 110. In another example, the fiducial mark 230 may be optionally positioned proximate a corner 240 of the cavity 140 (e.g., in a region near the cavity 140).

As described herein, the fiducial mark 230 may include the filler material, and the filler material may be coupled to the layer of conductive material 200 and/or the substrate 110. In an example, the filler material includes the first dielectric material 120, and the filler material is positioned in (e.g., deposited into) the void 220 defined in the layer of conductive material 200. Excess first dielectric material 120 may be removed from the electronic device 100, and the filler material positioned in the void 220 is cured. The filler material positioned in the void 220 may be coupled to the conductive layer 200 and/or the substrate 110 (e.g., by a curing operation). In an example, the fiducial mark 230 includes the first dielectric material 120 that is positioned in the void 220 and cured.

A person having ordinary skill in the art will appreciate that other operations are possible to create the electronic device 100 including the fiducial mark 230. For instance, the filler material may be cured (e.g., in the configurations shown in FIGS. 3-6) to form the fiducial mark 230, and the layer of conductive material 200 may be coupled to (e.g., surround, or envelop) the fiducial mark 230. Additionally, the filler material may substantially fill the void 220 (e.g., if the filler material does not flow to the bottom of, and completely fill, the void 220).

The fiducial mark 230 may have a lower reflectivity in comparison to the conductive material included in the layer of conductive material 200. In an example, the conductive material may reflect light with a greater intensity (e.g., have a higher reflectance) than the fiducial mark 230. In another example, light may be absorbed by (e.g., trapped, captured, or refracted within) the void 220, and the layer of conductive material 200 is brighter in contrast to the void 220. In yet another example, the fiducial mark 230 includes the first dielectric material 120 (shown in FIG. 1) and the first dielectric material 120 absorbs more light in comparison to the layer of conductive material 200. The dissimilar reflectivity between the fiducial mark 230 and the conductive layer 200 may help improve the contrast between the fiducial mark 230 and the conductive material 200. In still yet another example, the surface roughness of the conductive layer 200 is lower than the surface roughness of the void 220 (e.g., the conductive layer 200 has been polished, and the void 220 was unaffected by the polishing operation) and the dissimilar surface roughness may help improve the contrast between the fiducial mark 230 and the layer of conductive material 200. Improving the contrast between the fiducial mark 230 and the layer of conductive material 200 may help improve the detectability of the fiducial mark 230 (e.g., when an observer is attempting to locate the fiducial mark 230 included in the electronic device 100). Improving the detectability of the fiducial mark 230 helps reduce labor associated with locating the fiducial mark 230, and may help reduce the costs associated with manufacturing the electronic device 100. Additionally, and as discussed in greater detail herein, improving the detectability of the fiducial mark 230 helps improve the accuracy and precision associated with using the fiducial mark 230 as a reference point. In an example, the fiducial mark 230 may be utilized (e.g., referenced by a user or by a machine) as a reference point in a positioning operation to position the semiconductor die 150 in the cavity 140, shown in FIG. 1).

In another example, the fiducial mark 230 is utilized to position (e.g., align) and couple the semiconductor die 150 with a surface (e.g., a top surface) of the substrate 110. In yet another example, the fiducial mark 230 is utilized to position (and couple) electrical components (e.g. resistors, capacitors, inductors, or the like) with respect to the substrate 110. Improving the accuracy and precision associated with using the fiducial mark 230 may improve the performance of the electronic device 100, and may help reduce the waste associated with manufacturing the electronic device 100. Additionally, the fiducial mark 230 may help improve the performance of the electronic device 100 because the increase in accuracy and precision of positioning the semiconductor die 150 with respect to the substrate 110 allows for structures of the semiconductor die 150 (e.g., the die contacts 160 of FIG. 1) to have a tighter density (e.g., pitch) and thereby provide additional electrical communication pathways for the semiconductor die 150 (e.g., I/O density).

As described herein, the fiducial mark 230 may be utilized as a reference point. For instance, the fiducial mark 230 may be adapted to locate the semiconductor die 150 with respect to the cavity 140 defined in the substrate 110. The fiducial mark 230 may help determine the geometric properties of the electronic device 100. The fiducial mark 230 may help determine the amount of translation or rotation (or other degrees of freedom) necessary to accurately and precisely position the semiconductor die 150 with respect to the substrate 110, for example positioning the semiconductor die 150 in the cavity 140.

Figure 3:
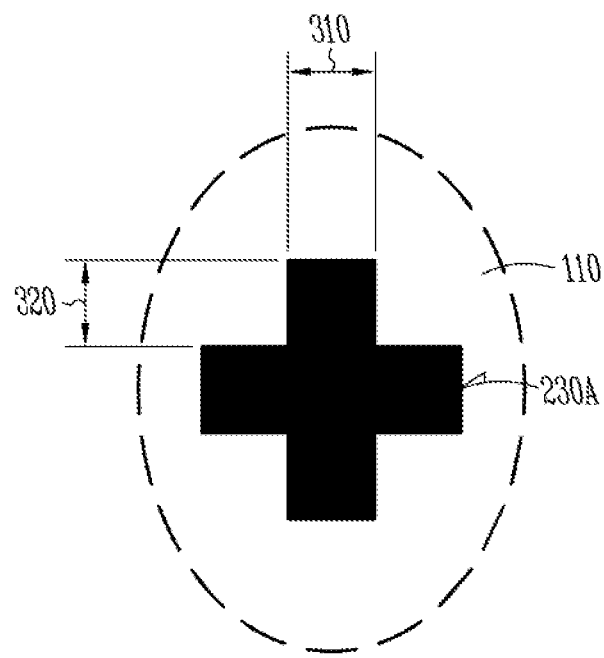
FIG. 3 illustrates a detailed schematic view at the line 2-2 of the electronic device of FIG. 2, including one example of a fiducial mark, in accordance with an example of the present subject matter.

FIG. 3 illustrates a detailed schematic view at the line 2-2 of the electronic device 100 of FIG. 2, including one example of the fiducial mark 230, in accordance with an example of the present subject matter. The electronic device 100 may include one or more configurations of the fiducial mark 230. For instance, and as shown in FIG. 3, the fiducial mark 230 may include a perimeter that defines a cross (e.g., the fiducial mark 230 may be shaped as a cross). Similarly, and in an example, the void 220 in the layer of conductive material 200 (shown in FIG. 2) defines a cross shape corresponding to the perimeter of the fiducial mark 230.

The fiducial mark 230 may have a first dimension 310 (e.g., a width) and a second dimension 320 (e.g., a length). The first dimension 310 and the second dimension 320 of the fiducial mark 230 may be equal.

Figure 4:
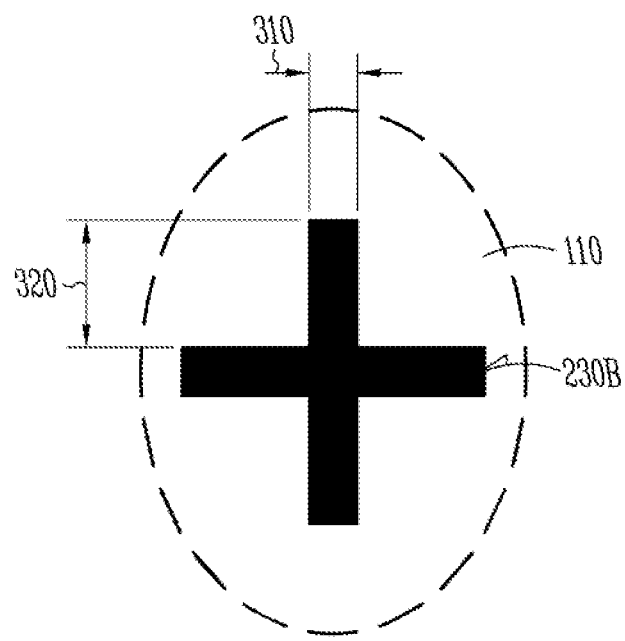
FIG. 4 illustrates a detailed schematic view at the line 2-2 of the electronic device of FIG. 2, including another example of the fiducial mark, in accordance with an example of the present subject matter.

FIG. 4 illustrates a detailed schematic view at the line 2-2 of the electronic device 100 of FIG. 2, including another example of the fiducial mark 230, in accordance with an example of the present subject matter. As described herein, the electronic device 100 may include one or more configurations of the fiducial mark 230. In an example, the first dimension 310 (e.g., width) and the second dimension 320 (e.g. length) vary with respect to each other. In some examples, the first dimension 310 (e.g., thickness) of the fiducial mark 230 is less than half the second dimension 320 (e.g., a length). For instance, the first dimension 310 may be 20 micrometers. The second dimension 320 may be 45 micrometers. An overall height of the fiducial mark 230 may be 110 micrometers. The overall height of the fiducial mark 230 may be within a range of 100 micrometers to 350 micrometers, however the present subject matter is not so limited.

Figure 5:
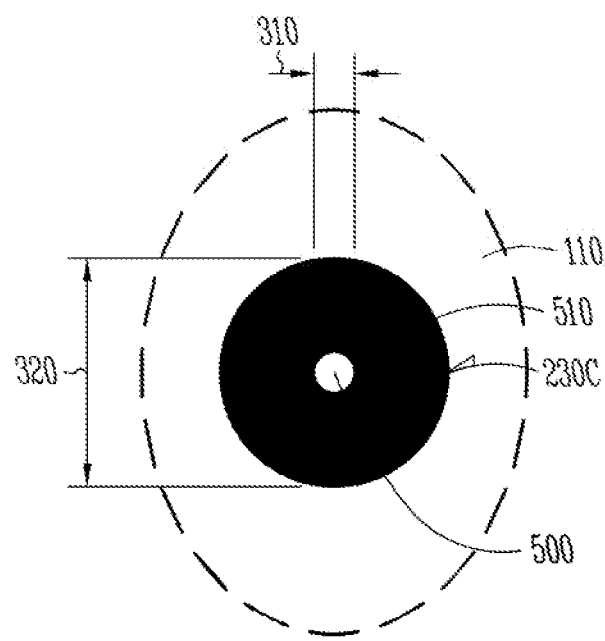
FIG. 5 illustrates a detailed schematic view at the line 2-2 of the electronic device of FIG. 2, including yet another example of the fiducial mark, in accordance with an example of the present subject matter.

FIG. 5 illustrates a detailed schematic view at the line 2-2 of the electronic device 100 of FIG. 2, including yet another example of the fiducial mark 230, in accordance with an example of the present subject matter. As discussed in this document, the electronic device 100 may include one or more configurations of the fiducial mark 230. For example, and as shown in FIG. 5, the fiducial mark 230 may include a perimeter that defines a circular shape (e.g., the fiducial mark 230 may be a circle).

Figure 6:
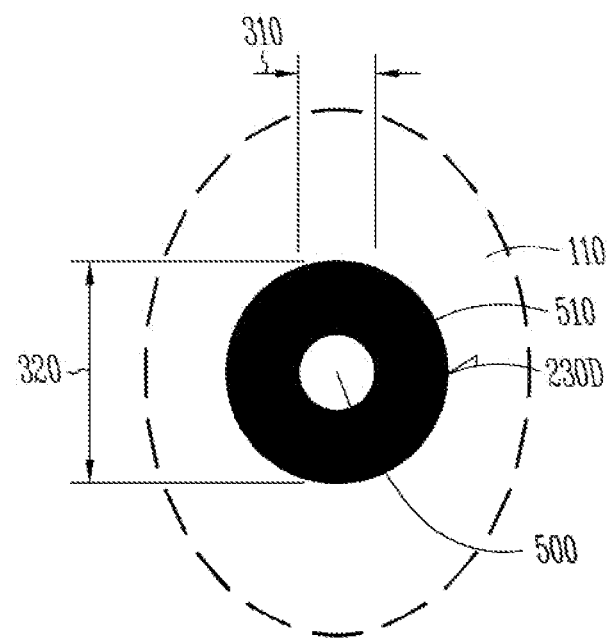
FIG. 6 illustrates a detailed schematic view at the line 2-2 of the electronic device of FIG. 2, including a further example of the fiducial mark, in accordance with an example of the present subject matter.

In another example, the fiducial mark 230 includes an interior region 500 and an outer region 510. For example, and as shown in FIGS. 5 and 6, the fiducial mark 230 may be configured as a ring. An area of the interior region 500 may be less than the area of outer region 510. The void 220 (shown in FIG. 2) in the layer of conductive material 200 may define the interior region 500 and the outer region 510 of the fiducial mark 230. For example, the cured photoresist (described with reference to FIG. 2) may be configured as a ring, and dielectric material may replace the cured photoresist material (after various manufacturing operations for the electronic device 100).

The interior region 500 may help improve the contrast and/or detectability of the fiducial mark 230. For instance, the fiducial mark 230 may include dissimilar materials. In an example, the outer region 510 includes a dielectric material (e.g., the first dielectric material 120 of FIG. 1) and the interior region 500 includes conductive material (e.g., the layer of conductive material 200 shown in FIG. 2).

Although the fiducial mark 230 is described as (among other things) a ring, the present subject matter is not so limited. For example, the perimeter of the fiducial mark 230 (e.g., the outer region 510) may define a variety of shapes, including but not limited to: crosses, circles, ellipses, rings, triangles, stars, polygons, x-shapes, amorphous shapes, or the like. Similarly, the perimeter of the interior region 500 may define the variety of shapes. The configuration of the interior region 500 may be dissimilar to the outer region 510 of the fiducial mark 230. In an example, the interior region 500 may be a square, and the outer region is circular.

FIG. 6 illustrates a detailed schematic view at the line 2-2 of the electronic device 100 of FIG. 2, including a further example of the fiducial mark 230, in accordance with an example of the present subject matter. The area of the interior region 500 and the outer region 510 may vary. In an example, the area of interior region 500 the may be equal to the area of the outer region 510. The interior region 500 may have the first dimension 310 (e.g., diameter) and the outer region 510 may have the second dimension 320.

Figure 7A:
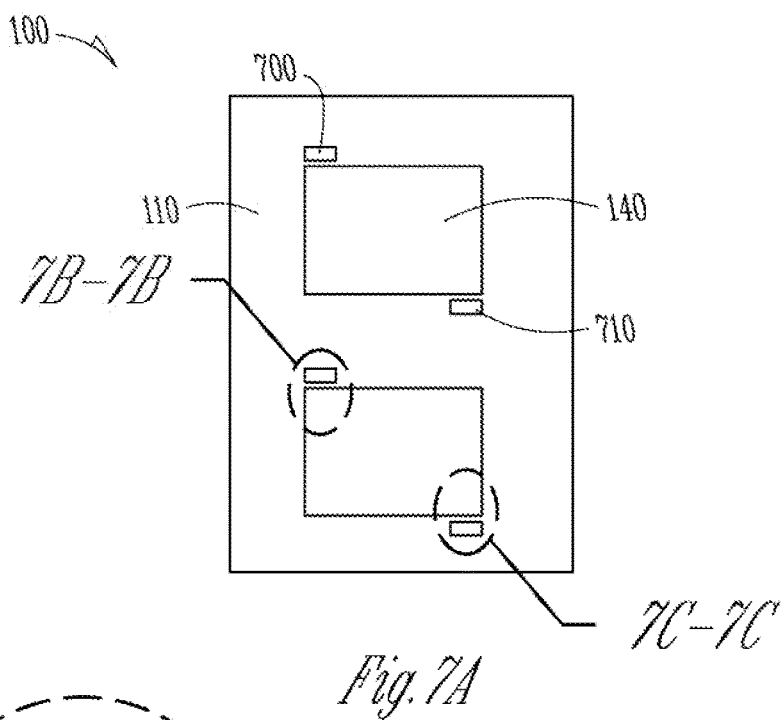
FIG. 7A illustrates a schematic, planar view of another example of the electronic device, in accordance with an example of the present subject matter.

FIG. 7A illustrates a schematic, planar view of another example of the electronic device 100, in accordance with an example of the present subject matter. As described herein, the electronic device 100 may include the substrate 110 that defines the cavity 140. A fiducial mark (e.g., the fiducial mark 230 of FIGS. 1-6) may be positioned proximate the cavity 140.

The electronic device 100 (e.g., the substrate 110) may include a first conductive region 700 and may include a second conductive region 710. The first conductive region 700 and the second conductive region 710 may include one or more fiducial marks (e.g., the fiducial mark 230 of FIGS. 1-6). The first conductive region 700 and the second conductive region 710 may include a region of conductive material (e.g., copper, gold, aluminum, or the like), and the region of conductive material may be enclosed (e.g., surrounded, encompassed, or the like) by dielectric material (e.g., the first dielectric material 120 of FIG. 1).

As discussed in greater detail herein, the first conductive region 700 and the second conductive region 710 may be included in the electronic device 100, and for example may be positioned proximate the cavity 140. In some examples, the first conductive region 700 and the second conductive region 710 are positioned proximate a corner (e.g., opposite corners) of the cavity 140 defined in the substrate 110.

Figure 7B:
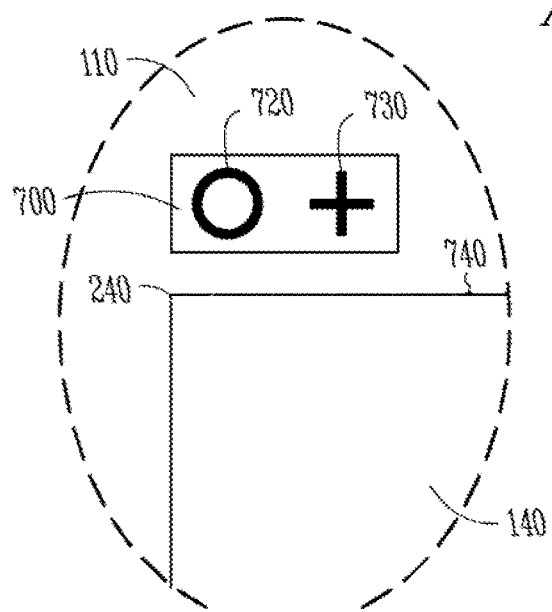
FIG. 7B illustrates a detailed schematic view at the line 7B-7B of FIG. 7A, including an example of one or more fiducial marks, in accordance with an example of the present subject matter.

FIG. 7B illustrates a detailed schematic view at the line 7B-7B of FIG. 7A, including an example of one or more fiducial marks, in accordance with an example of the present subject matter. In some examples, the first conductive region 700 is positioned proximate the periphery of the cavity 140, however the present subject matter is not so limited. In an example, the first conductive region 700 may be positioned proximate a first edge 740 of the cavity 140. In another example, the first conductive region 700 may be positioned proximate the corner 240 of the cavity 140. The first conductive region 700 may include, but is not limited to, a first fiducial mark 720 and a second fiducial mark 730. The first fiducial mark 720 may have a first perimeter shape (e.g., a ring) and the second fiducial mark 730 may have a second perimeter shape (e.g., a cross).

Figure 7C:
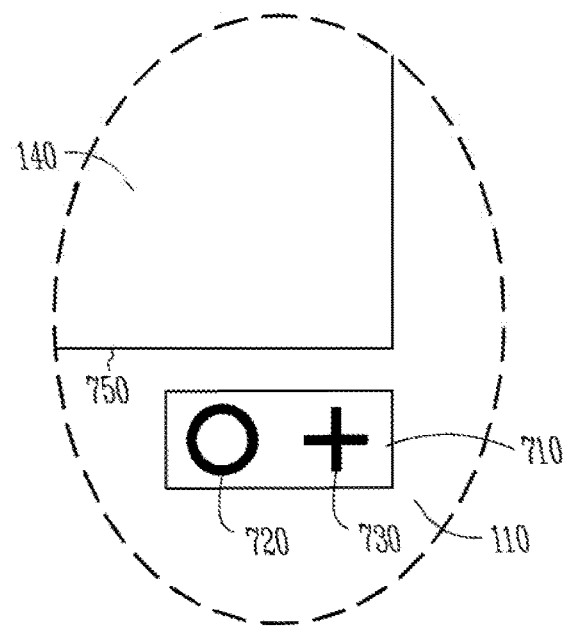
FIG. 7C illustrates a detailed schematic view at the line 7C-7C of FIG. 7A, including an example of one or more fiducial marks, in accordance with an example of the present subject matter.

FIG. 7C illustrates a detailed schematic view at the line 7C-7C of FIG. 7A, including an example of one or more fiducial marks, in accordance with an example of the present subject matter. The second conductive region 710 may be positioned proximate a second edge 750 of the cavity 140. Additionally, the second conductive region 710 may be positioned proximate the corner 240 of the cavity 140. The second conductive region 710 may include, but is not limited to, the first fiducial mark 720 and the second fiducial mark 730. As described herein, the first fiducial mark 720 may have a first perimeter shape (e.g., a ring) and the second fiducial mark 730 may have a second perimeter shape (e.g., a star).

Figure 8A:
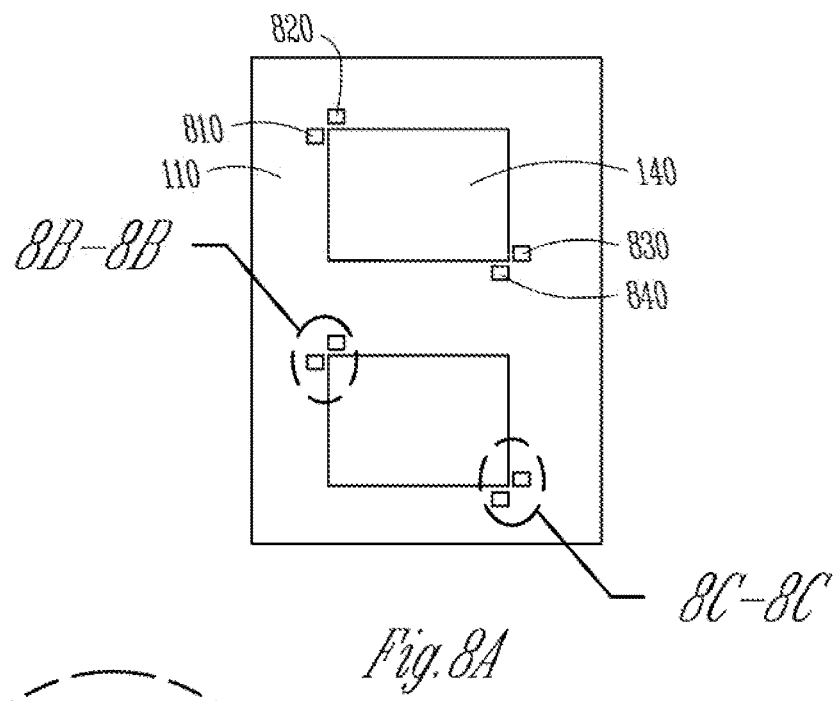
FIG. 8A illustrates a schematic, planar view of yet another example of the electronic device, in accordance with an example of the present subject matter.

FIG. 8A illustrates a schematic, planar view of yet another example of the electronic device, in accordance with an example of the present subject matter. The electronic device 100 may include one or more conductive regions. For instance, the electronic device 100 may include a first conductive region 810, a second conductive region 820, a third conductive region 830, and may include a fourth conductive region 840 (collectively the "conductive regions 810-840"), but the present subject matter is not so limited. The conductive regions 810-840 may be positioned proximate the cavity. The conductive regions 810-840 may be positioned proximate the corners (e.g., corner 240 shown in FIGS. 2, 7B, and 8B) of the cavity 140.

As shown in FIG. 1, the substrate 110 may define a plurality of cavities, including the cavity 140. The substrate 110 may be utilized in one or more manufacturing operations (e.g., plating, coupling with the semiconductor die 150 of FIGS. 1-2, singulating, or the like) to produce electronic devices, such as the electronic device 100.

Figure 8B:
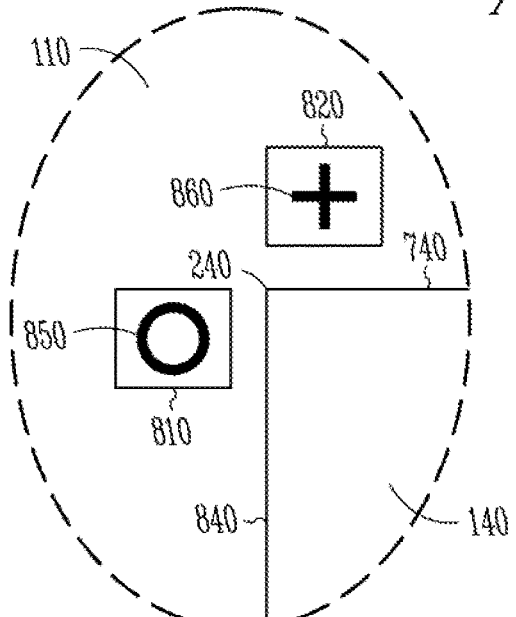
FIG. 8B illustrates a detailed schematic view at the line 8B-8B of FIG. 8A, including an example of one or more fiducial marks, in accordance with an example of the present subject matter.

FIG. 8B illustrates a detailed schematic view at the line 8B-8B of FIG. 8A, including an example of one or more fiducial marks, in accordance with an example of the present subject matter. The first conductive region 810 and the second conductive region 820 may be positioned proximate an edge of the cavity 140 (e.g., the first edge 740 and a third edge). The first conductive region 810 and the second conductive region 820 may be positioned proximate the corner 240 of the cavity 140.

The first conductive region 810 may include one or more fiducial marks, including but not limited to a first fiducial mark 850. The second conductive region 820 may include one or more fiducial marks, including but not limited to a second fiducial mark 860. The first fiducial mark 810 and the second fiducial mark 860 may have the same configuration (e.g., perimeter shape) or may have differing configurations (e.g., the examples of the fiducial mark 230 of FIGS. 3-6).

Figure 8C:
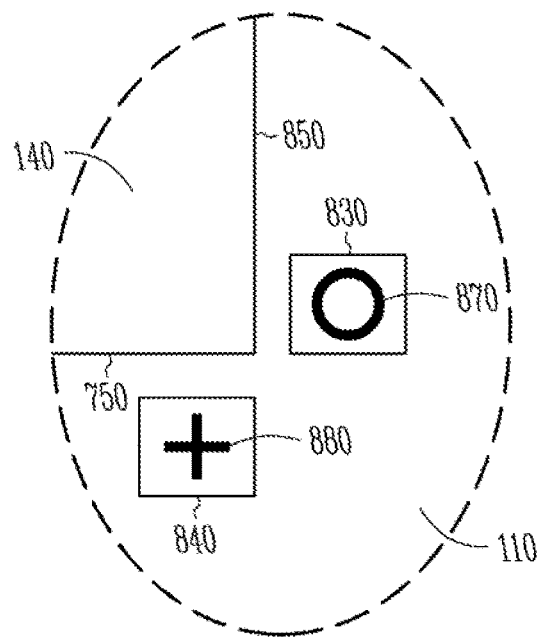
FIG. 8C illustrates a detailed schematic view at the line 8C-8C of FIG. 8A, including an example of one or more fiducial marks, in accordance with an example of the present subject matter.

FIG. 8C illustrates a detailed schematic view at the line 8C-8C of FIG. 8A, including an example of one or more fiducial marks, in accordance with an example of the present subject matter. The third conductive region 830 and the fourth conductive region 840 may be positioned proximate an edge of the cavity 140 (e.g., the second edge 750 and a fourth edge 850). The third conductive region 830 and the fourth conductive region 840 may be positioned proximate a corner (e.g., the corner 240 of FIGS. 2, 7B, and 8B) of the cavity 140. The third conductive region 830 may be positioned on a first side of the corner, and the fourth conductive region 840 may be positioned on a second side of the corner.

The third conductive region 830 may include one or more fiducial marks, including but not limited to a third fiducial mark 870. The fourth conductive region 840 may include one or more fiducial marks, including but not limited to a fourth fiducial mark 880. The third fiducial mark 870 and the fourth fiducial mark 880 may have the same configuration (e.g., perimeter shape) or may have differing configurations (e.g., the examples of the fiducial mark 230 of FIGS. 3-6).

Figure 9:
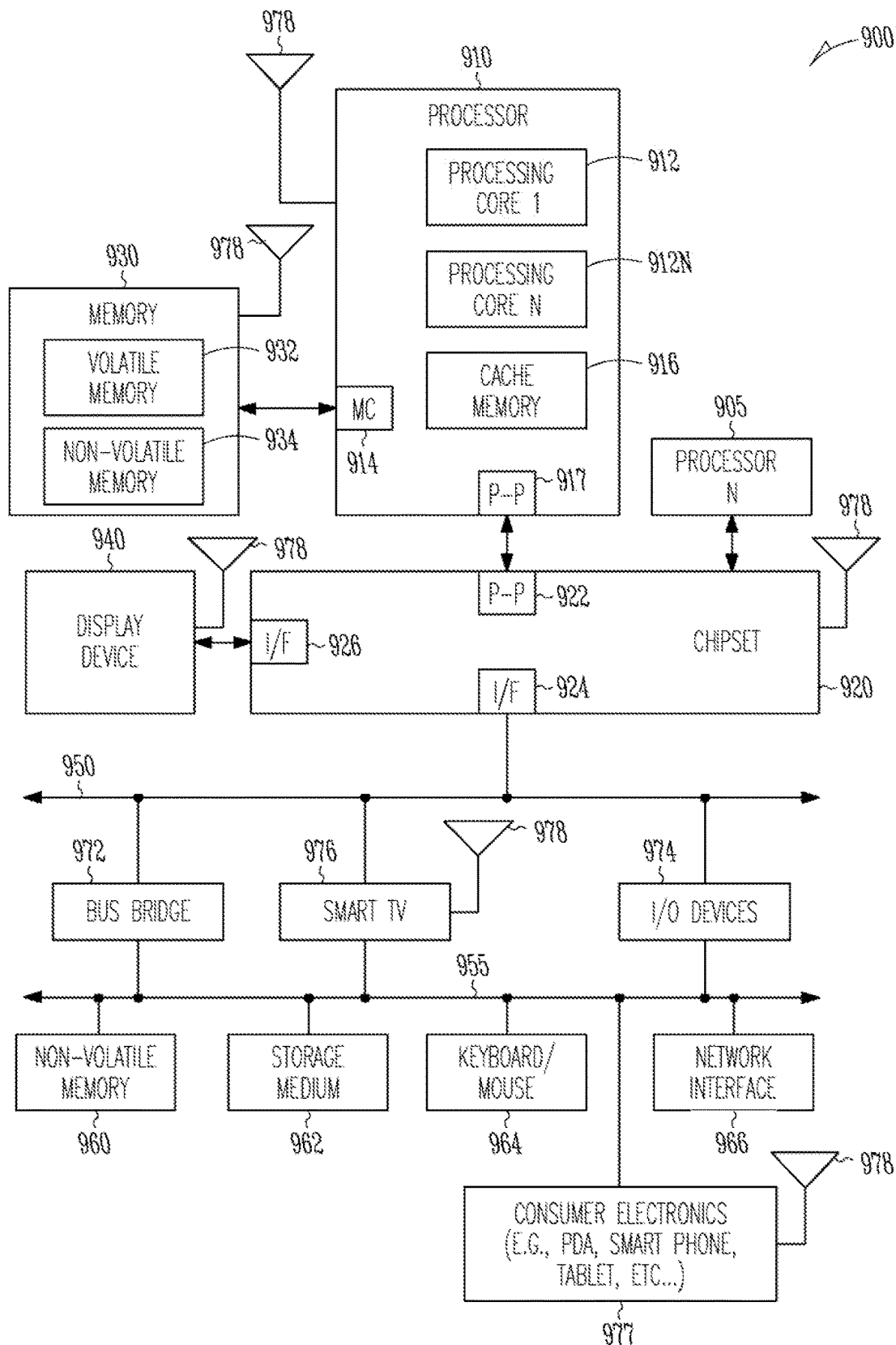
FIG. 9 illustrates a system level diagram, depicting an example of an electronic device (e.g., system) including the electronic device 100 as described in the present disclosure.

FIG. 9 illustrates a system level diagram, depicting an example of an electronic device (e.g., system) including the electronic device 100 as described in the present disclosure. FIG. 9 is included to show an example of a higher level device application for the electronic device 100. In one embodiment, system 900 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 900 is a system on a chip (SOC) system.

In one embodiment, processor 910 has one or more processor cores 912 and 912N, where 912N represents the Nth processor core inside processor 910 where N is a positive integer. In one embodiment, system 900 includes multiple processors including 910 and 905, where processor 905 has logic similar or identical to the logic of processor 910. In some embodiments, processing core 912 includes, but is not limited to, pre-fetch logic to fetch instructions, decode logic to decode the instructions, execution logic to execute instructions and the like. In some embodiments, processor 910 has a cache memory 916 to cache instructions and/or data for system 900. Cache memory 916 may be organized into a hierarchal structure including one or more levels of cache memory.

In some embodiments, processor 910 includes a memory controller 914, which is operable to perform functions that enable the processor 910 to access and communicate with memory 930 that includes a volatile memory 932 and/or a non-volatile memory 934. In some embodiments, processor 910 is coupled with memory 930 and chipset 920. Processor 910 may also be coupled to a wireless antenna 978 to communicate with any device configured to transmit and/or receive wireless signals. In one embodiment, an interface for wireless antenna 978 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 932 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 934 includes, but is not limited to, flash memory, phase change memory (PCM), read-only memory (ROM), electrically erasable programmable read-only memory (EEPROM), or any other type of non-volatile memory device.

Memory 930 stores information and instructions to be executed by processor 910. In one embodiment, memory 930 may also store temporary variables or other intermediate information while processor 910 is executing instructions. In the illustrated embodiment, chipset 920 connects with processor 910 via Point-to-Point (PtP or P-P) interfaces 917 and 922. Chipset 920 enables processor 910 to connect to other elements in system 900. In some embodiments of the example system, interfaces 917 and 922 operate in accordance with a PtP communication protocol such as the Intel® QuickPath Interconnect (QPI) or the like. In other embodiments, a different interconnect may be used.

In some embodiments, chipset 920 is operable to communicate with processor 910, 905N, display device 940, and other devices, including a bus bridge 972, a smart TV 976, I/O devices 974, nonvolatile memory 960, a storage medium (such as one or more mass storage devices) 962, a keyboard/mouse 964, a network interface 966, and various forms of consumer electronics 977 (such as a PDA, smart phone, tablet etc.), etc. In one embodiment, chipset 920 couples with these devices through an interface 924. Chipset 920 may also be coupled to a wireless antenna 978 to communicate with any device configured to transmit and/or receive wireless signals.

Chipset 920 connects to display device 940 via interface 926. Display 940 may be, for example, a liquid crystal display (LCD), a plasma display, cathode ray tube (CRT) display, or any other form of visual display device. In some embodiments of the example system, processor 910 and chipset 920 are merged into a single SOC. In addition, chipset 920 connects to one or more buses 950 and 955 that interconnect various system elements, such as I/O devices 974, nonvolatile memory 960, storage medium 962, a keyboard/mouse 964, and network interface 966. Buses 950 and 955 may be interconnected together via a bus bridge 972.

In one embodiment, mass storage device 962 includes, but is not limited to, a solid state drive, a hard disk drive, a universal serial bus flash memory drive, or any other form of computer data storage medium. In one embodiment, network interface 966 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 9 are depicted as separate blocks within the system 900, the functions performed by some of these blocks may be integrated within a single semiconductor circuit or may be implemented using two or more separate integrated circuits. For example, although cache memory 916 is depicted as a separate block within processor 910, cache memory 916 (or selected aspects of 916) may be incorporated into processor core 912.

Figure 10:
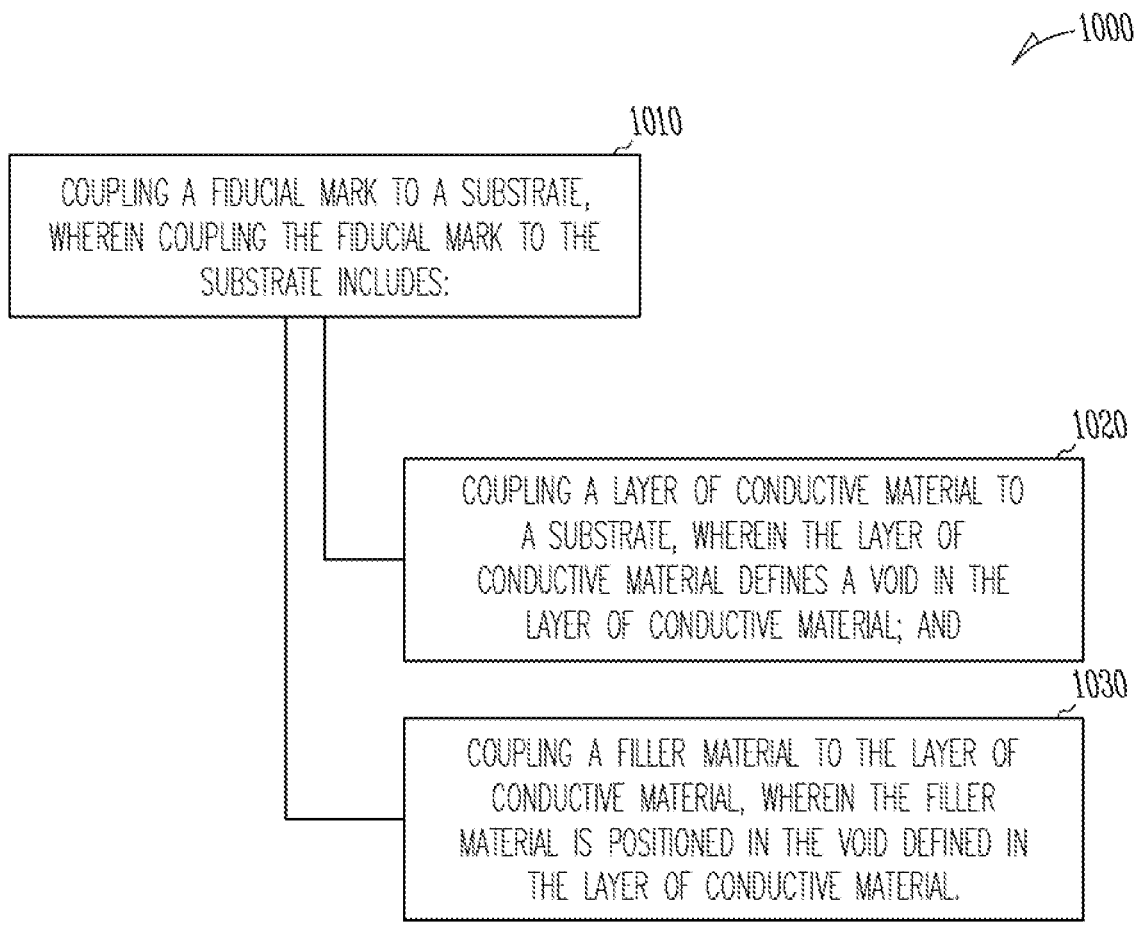
FIG. 10 illustrates one example of a method 1000 for manufacturing an electronic device, including one or more of the electronic device 100 described herein.

FIG. 10 illustrates one example of a method 1000 for manufacturing an electronic device, including one or more of the electronic device 100 described herein. In describing the method 1000, reference is made to one or more components, features, functions and operations previously described herein. Where convenient, reference is made to the components, features, operations and the like with reference numerals. The reference numerals provided are exemplary and are not exclusive. For instance, components, features, functions, operations and the like described in the method 1000 include, but are not limited to, the corresponding numbered elements provided herein and other corresponding elements described herein (both numbered and unnumbered) as well as their equivalents.

At 1010, the method 1000 may include coupling a fiducial mark 230 to a substrate 110. At 1020, the method 1000 may include coupling a layer of conductive material 200 to the substrate 110. The layer of conductive material 200 may define a void 220 in the layer of conductive material 200. At 1030, the method 1000 may include coupling a dielectric material (e.g., the first dielectric material 120 of FIG. 1) to the layer of conductive material 200. The dielectric material may be positioned in the void 220 defined in the layer of conductive material 200.

As described herein, the substrate 110 may define a cavity 140 in the substrate 110. The method 1000 may include that the fiducial mark may be positioned proximate the cavity 140. The method 1000 may include coupling an semiconductor die 150 to the substrate 110. The method 1000 may include positioning the semiconductor die 150 in the cavity 140 defined by the substrate 110. The fiducial mark 230 positioned proximate the cavity 140 may be referenced to determine a position of the semiconductor die 150 with respect to the cavity 140. The fiducial mark 230 may be observed with a camera (e.g., in an automated process), and the fiducial mark 230 may help align the semiconductor die 150 with respect to the cavity 140.

The method 1000 may include exposing the electronic device 100 with light provided by a light source. The light source may provide ultraviolet light, visible light, or infrared light. The light may be incident upon (e.g., shined at angle with respect to) an exposed surface (e.g., a top surface, or the surface shown in FIG. 2) of the electronic device 100. Exposing light incident upon the electronic device may help improve the contrast between the fiducial mark 230 and the layer of conductive material 200. For instance, the light may reflect off the layer of conductive material 200, and the layer of conductive material 200 may appear to be bright. The light may refract inside the fiducial mark 239, and the fiducial mark 239 may appear darker in comparison to the layer of conductive material 200. A person having ordinary skill in the art will appreciate that terms such as "bright" or "dark" are relational and that a dark object will have, for instance less luminance than a brighter object.

VARIOUS NOTES & EXAMPLES

Aspect 1 may include or use subject matter (such as an apparatus, a system, a device, a method, a means for performing acts, or a device readable medium including instructions that, when performed by the device, may cause the device to perform acts, or an article of manufacture), such as may include or use an electronic device. The electronic device may include a substrate. The substrate may include one or more layers. The one or more layers may include a first dielectric material and may include one or more electrical traces. The electronic device may include a layer of conductive material. The layer of conductive material may define a void in the conductive material. The electronic device may include a fiducial mark. The fiducial mark may include a filler material. The filler material may be positioned in the void defined by the conductive material. The filler material may be coupled to the layer of conductive material. The filler material may have a lower reflectivity in comparison to the conductive material to provide a contrast with the conductive material.

Aspect 2 may include or use, or may optionally be combined with the subject matter of Aspect 1, to optionally include or use that the layer of conductive material may include copper.

Aspect 3 may include or use, or may optionally be combined with the subject matter of one or any combination of Aspects 1 or 2 to optionally include or use that a perimeter of the fiducial mark may define a cross.

Aspect 4 may include or use, or may optionally be combined with the subject matter of Aspect 3 to optionally include or use that a thickness of a leg of the cross may be less than half a length of the leg of the cross.

Aspect 5 may include or use, or may optionally be combined with the subject matter of one or any combination of Aspects 1 through 4 to optionally include or use that a perimeter of the void may define a ring.

Aspect 6 may include or use, or may optionally be combined with the subject matter of one or any combination of Aspects 1 through 5 to optionally include or use that the fiducial mark may include an inner portion and an outer portion, and the inner portion includes the conductive material and the outer portion includes the first dielectric material.

Aspect 7 may include or use, or may optionally be combined with the subject matter of Aspect 6 to optionally include or use that an area of the inner portion is less than an area of the outer portion.

Aspect 8 may include or use subject matter (such as an apparatus, a system, a device, a method, a means for performing acts, or a device readable medium including instructions that, when performed by the device, may cause the device to perform acts, or an article of manufacture), such as may include or use an electronic device. The electronic device may include a substrate. The substrate may include one or more layers. The one or more layers may include a first dielectric material. The one or more layers may include one or more electrical traces. The electronic device may include a cavity. The cavity may be defined in the substrate. The cavity may be adapted to receive a semiconductor die. The electronic device may include a layer of conductive material. The layer of conductive material may define a void in the conductive material. The electronic device may include a fiducial mark. The fiducial mark may include a filler material. The filler material may be positioned in the void defined by the conductive material. The filler material may be coupled to the layer of conductive material, wherein the fiducial mark is positioned proximate the cavity defined in the substrate. The filler material may have a lower reflectivity in comparison to the conductive material to provide a contrast with the conductive material.

Aspect 9 may include or use, or may optionally be combined with the subject matter of Aspect 8, to optionally include or use the semiconductor die. The semiconductor die may be positioned in the cavity and coupled to the substrate.

Aspect 10 may include or use, or may optionally be combined with the subject matter of Aspect 9 to optionally include or use that the semiconductor die is a first semiconductor die, and the first semiconductor die is adapted to electrically interconnect a second semiconductor die and a third semiconductor die.

Aspect 11 may include or use, or may optionally be combined with the subject matter of one or any combination of Aspects 9 or 10 to optionally include or use that the fiducial mark may be adapted to locate the semiconductor die with respect to the cavity defined in the substrate.

Aspect 12 may include or use, or may optionally be combined with the subject matter of one or any combination of Aspects 8 through 11 to optionally include or use that a periphery of the cavity that may be defined by the substrate may be rectangular. The fiducial mark may be positioned proximate a corner of the cavity.

Aspect 13 may include or use, or may optionally be combined with the subject matter of Aspect 12 to optionally include or use that the fiducial mark may be a first fiducial mark. The first fiducial mark may be positioned proximate a first side of the corner. The electronic device may include a second fiducial mark. The second fiducial mark may be positioned proximate a second side of the corner.

Aspect 14 may include or use, or may optionally be combined with the subject matter of one or any combination of Aspects 8 through 13 to optionally include or use that the cavity that may be defined in the substrate may extend only partially through a thickness of the substrate.

Aspect 15 may include or use subject matter (such as an apparatus, a system, a device, a method, a means for performing acts, or a device readable medium including instructions that, when performed by the device, may cause the device to perform acts, or an article of manufacture), such as may include or use a method for manufacturing an electronic device. The method may include coupling a fiducial mark to a substrate. Coupling the fiducial mark to the substrate may include coupling a layer of conductive material to the substrate. The layer of conductive material may define a void in the layer of conductive material. Coupling the fiducial mark to the substrate may include coupling a dielectric material to the layer of conductive material. The dielectric material may be positioned in the void defined in the layer of conductive material.

Aspect 16 may include or use, or may optionally be combined with the subject matter of Aspect 15, to optionally include or use that the substrate may define a cavity in the substrate. The fiducial mark may be positioned proximate the cavity.

Aspect 17 may include or use, or may optionally be combined with the subject matter of Aspect 16 to optionally include or use that the method may include coupling a semiconductor die to the substrate. Coupling the semiconductor die to the substrate may include positioning the semiconductor die in the cavity that may be defined by the substrate. The fiducial mark that may be positioned proximate the cavity may be referenced to determine a position of the semiconductor die with respect to the cavity defined by the substrate.

Aspect 18 may include or use, or may optionally be combined with the subject matter of one or any combination of Aspects 15 through 17 to optionally include or use that the method may include exposing the electronic device with light provided by a light source.

Aspect 19 may include or use, or may optionally be combined with the subject matter of Aspect 18 to optionally include or use that the light may be incident upon an exposed surface of the electronic device.

Aspect 20 may include or use, or may optionally be combined with the subject matter of one or any combination of Aspects 18 or 19 to optionally include or use that the light source may provide ultraviolet light, visible light, or infrared light.

Aspect 21 may include or use, or may optionally be combined with any portion or combination of any portions of any one or more of Aspects 1 through 20 to include or use, subject matter that may include means for performing any one or more of the functions of Aspects 1 through 20, or a machine-readable medium including instructions that, when performed by a machine, cause the machine to perform any one or more of the functions of Aspects 1 through 20.

Each of these non-limiting examples may stand on its own, or may be combined in various permutations or combinations with one or more of the other examples.

The above description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A method for manufacturing an electronic device, comprising:
   forming a fiducial mark on a substrate, the substrate having a cavity, and the fiducial mark positioned proximate the cavity, wherein forming the fiducial mark on the substrate includes:
   coupling a layer of conductive material to the substrate, wherein the layer of conductive material defines a void in the layer of conductive material; and coupling a filler material to the layer of conductive material, wherein the filler material is positioned in the void defined in the layer of conductive material; and coupling a semiconductor die to the substrate by positioning the semiconductor die in the cavity using the fiducial mark.

2. The method of claim 1, further comprising exposing the electronic device with light provided by a light source.

3. The method of claim 2, wherein the light is incident upon an exposed surface of the electronic device.

4. The method of claim 2, wherein the light source provides ultraviolet light, visible light, or infrared light.

5. A method of fabricating an electronic device, the method comprising:

forming a cavity in a substrate, the substrate including one or more layers, the one or more layers including a dielectric material and one or more electrical traces, wherein the cavity is adapted to receive a semiconductor die;

forming a layer of conductive material, wherein the layer of conductive material defines a void in the conductive material;

forming a fiducial mark including a filler material positioned in the void defined by the conductive material and coupled to the layer of conductive material, wherein the fiducial mark is positioned proximate the cavity defined in the substrate, and wherein the filler material has a lower reflectivity in comparison to the conductive material to provide a contrast with the conductive material; and coupling the semiconductor die to the substrate by positioning the semiconductor die in the cavity using the fiducial mark.

6. The method of claim 5, wherein the semiconductor die is a first semiconductor die, and the first semiconductor die is adapted to electrically interconnect a second semiconductor die and a third semiconductor die.

7. The method of claim 5, wherein the fiducial mark is adapted to locate the semiconductor die with respect to the cavity defined in the substrate.

8. The method of claim 5, wherein a periphery of the cavity defined by the substrate is rectangular, and the fiducial mark is positioned proximate a corner of the cavity.

9. The method of claim 8, wherein the fiducial mark is a first fiducial mark, and the first fiducial mark is positioned proximate a first side of the corner, and further comprising a second fiducial mark, wherein the second fiducial mark is positioned proximate a second side of the corner.

10. The method of claim 5, wherein the cavity defined in the substrate extends only partially through a thickness of the substrate.

11. A method of fabricating an electronic device, the method comprising:

providing a chipset; and coupling a processor to the chipset, wherein forming the processor comprises:

forming a substrate including one or more layers, the one or more layers including a dielectric material and a conductive material;

forming a cavity in the substrate;

forming a fiducial mark, the fiducial mark including a filler material positioned in a void defined by the conductive material, wherein the fiducial mark is positioned proximate the cavity in the substrate; and coupling a semiconductor die to the substrate by positioning the semiconductor die in the cavity using the fiducial mark.

12. The method of claim 11, the method further comprising:

coupling a display device to the chipset.

13. The method of claim 11, the method further comprising:

coupling a Smart TV to the chipset.

14. The method of claim 11, the method further comprising:

coupling a storage medium to the chipset.

15. The method of claim 11, the method further comprising:

coupling a keyboard/mouse to the chipset.

16. The method of claim 11, the method further comprising:

coupling a network to the chipset.

17. The method of claim 11, wherein the electronic device is selected from the group consisting of a desktop computer, a laptop computer, a netbook, a tablet, a notebook computer, a personal digital assistant (PDA), a server, a workstation, a cellular telephone, a mobile computing device, and a smart phone.

* * * * *